(12) United States Patent
Schacht et al.

(10) Patent No.: US 9,246,450 B2
(45) Date of Patent: Jan. 26, 2016

(54) APPARATUS AND METHOD FOR TESTING OF SUCCESSFUL OPERATION OF TRANSIMPEDANCE AMPLIFIERS

(71) Applicant: Texas Instruments Deutschland GmbH, Freising (DE)

(72) Inventors: Ulrich Schacht, Lower Saxony (DE); Oliver Piepenstock, Lower Saxony (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 75 days.

(21) Appl. No.: 13/970,320

(22) Filed: Aug. 19, 2013

(65) Prior Publication Data

US 2015/0048882 A1    Feb. 19, 2015

(51) Int. Cl.
*H03F 3/45* (2006.01)
*H03F 3/08* (2006.01)

(52) U.S. Cl.
CPC ............ *H03F 3/45071* (2013.01); *H03F 3/087* (2013.01); *H03F 3/45475* (2013.01); *H03F 3/45973* (2013.01); *H03F 2200/462* (2013.01); *H03F 2203/45212* (2013.01); *H03F 2203/45511* (2013.01); *H03F 2203/45521* (2013.01); *H03F 2203/45528* (2013.01); *H03F 2203/45536* (2013.01)

(58) Field of Classification Search
CPC ....... H03F 3/087; H03F 3/45475; H03F 3/08; H03F 3/082; H03F 3/347; H03F 2200/135; H03F 3/195; H03F 3/345; G01J 1/44; G01J 1/1626; G01J 1/4228; G01J 1/429; G01J 3/2803; G11B 7/13
USPC .............. 330/2, 59, 308; 250/214 A, 214 AG
See application file for complete search history.

(56) References Cited

U.S. PATENT DOCUMENTS

| 6,841,771 | B2 * | 1/2005 | Shimizu ................... 250/214 A |
| 7,205,845 | B2 * | 4/2007 | Harms et al. ................. 330/308 |
| 7,406,268 | B2 * | 7/2008 | Schrodinger ................ 398/202 |
| 7,868,701 | B2 * | 1/2011 | Nakamura et al. ............ 330/308 |
| 7,868,702 | B2 * | 1/2011 | Ohnishi ....................... 330/308 |
| 8,405,461 | B2 * | 3/2013 | Moto et al. .................... 330/308 |

* cited by examiner

*Primary Examiner* — Khanh V Nguyen
(74) *Attorney, Agent, or Firm* — Alan A. R. Cooper; Frank D. Cimino

(57) ABSTRACT

The present disclosure relates to an apparatus comprising at least two operational amplifiers, a first and a second current input, at least one voltage output, and at least two resistors, wherein a first current source is connectable to the first current input, and a test current source is connectable to the second current input, and wherein the first current input is connected to an inverting input of the first operational amplifier and the second current input is connected to an inverting input of the second operational amplifier, and a first feedback resistor is connected between the output and the inverting input of the first operational amplifier and a second feedback resistor is connected between the output and the inverting input of the second operational amplifier, and wherein the voltage output is connected to the outputs of the first and the second operational amplifier.

18 Claims, 2 Drawing Sheets

APPARATUS AND METHOD FOR TESTING OF SUCCESSFUL OPERATION OF TRANSIMPEDANCE AMPLIFIERS

TECHNICAL FIELD

This disclosure relates to the testing of successful operation of transimpedance amplifiers, and in particular to apparatus and methods for testing the gain of transimpedance amplifiers. More specifically, the examples of the present disclosure relate to testing the gain of transimpedance amplifiers during production.

BACKGROUND

A transimpedance amplifier is an amplifier that converts current to voltage. Its input ideally has zero impedance, and the input signal is a current. Its output may have low impedance. The output signal is measured as a voltage. As the output is a voltage and the input is a current, the gain, or ratio of output to input, is expressed in units of ohms.

Transimpedance amplifiers are commonly used in receivers for optical communications. The photodetector that generates the transimpedance amplifier's input current owns a capacitance. This capacitance in conjunction with the transimpedance amplifier's input impedance poses as a low pass filter, which limits the bandwidth of the signal chain. Therefore the transimpedance amplifiers input impedance should be as low as possible.

Transimpedance amplifiers are tested during production to guarantee their successful operation. According to one example known in the state of the art, a transimpedance amplifier comprises a first current input for the current of a photodiode and a second input for a test current. Both inputs may be connected in parallel with each other and to the inverting input of an operational amplifier. For testing the successful operation, a test current is applied to the test current input, in particular in form of a transient test current.

One disadvantage of the testing of operation of transimpedance amplifiers having a high gain ratio is that applying the test current can result in an undesired oscillation of the amplifier.

To be able to apply a test current to a transimpedance amplifier, a test current source is needed. The test current source itself has an inductance that can interact with the transimpedance amplifier and therefore causes the undesired oscillations. To damp these oscillations, it is known in the state of the art to provide a connection in series of the test current source and a resistor. The test input connected in parallel with the first input adds capacitance to the signal chain wherein said capacitance can degrade the performance of the transimpedance amplifier.

It is therefore one objective of the present disclosure to overcome the problems of oscillations of transimpedance amplifiers during testing and of a reduction of their performance during normal operation. Another objective of the present disclosure is to provide an apparatus and a method for improving the testing of transimpedance amplifiers.

SUMMARY

One aspect of the present disclosure is an apparatus configured to convert an input current to an output voltage. The apparatus may have according to one example of the present disclosure at least two operational amplifiers, a first and a second current input, at least one voltage output, and at least two resistors. A first current source may be connected to the first current input and a test current source may be connected to the second current input. The first current input may be connected to the inverting input of a first operational amplifier and the second current input may be connected to an inverting input of the second operational amplifier. A first feedback resistor may be connected between the output and the inverting input of the first operational amplifier and a second feedback resistor may be connected between the output and the inverting input of the second operational amplifier. The gain of the output of the first and the second operational amplifier may be set by the first and the second resistor respectively. The voltage output may be connected to the outputs of the first and the second operational amplifier.

According to one example of the present disclosure, for testing the successful operation of the apparatus, a test current may be applied to the second current input. A test current source always has a capacitance. Due to the high gain and bandwidth of the first operational amplifier, by applying a test current to the first current input the capacitance of the test current source might reduce the bandwidth of the transimpedance amplifier. The second operational amplifier may have in contrast to the first operational amplifier a narrower gain bandwidth. In particular, the second operational amplifier may have a gain bandwidth providing an amplification of frequencies lower than the first operational amplifier. Therefore, it may be beneficial according to the present disclosure that the test current input is connected to the second operational amplifier such that its capacitance does not affect the transimpedance amplifiers bandwidth.

According to one example of the present disclosure, the first operational amplifier may be configured to provide a gain bandwidth broader than the gain bandwidth of the second operational amplifier.

According to a further example of the present disclosure, the first operational amplifier may be configured to provide a gain bandwidth of 500 MHz to 6 GHz and the second operational amplifier may be configured to provide a gain bandwidth of 50 MHz to 300 MHz.

According to one example of the present disclosure, a current mirror may be provided, wherein the current mirror may be connected between the second current input and the inverting input of the second operational amplifier. According to one example, a current mirror input of the current mirror may be connected to the second current input and a current mirror output may be connected to the inverting input of the second operational amplifier.

To avoid oscillations, the second current input may be connected to a current mirror input. A current mirror is a circuit designed to copy a current through one active device by controlling the current in another active device of a circuit. By the help of the current mirror, a current source may be provided having a defined and limited capacitance at the current mirror output. Connecting the copied test current to the inverting input of the second operational amplifier results therefore in further avoiding bandwidth limitations in the main signal path of the apparatus.

According to another example of the present disclosure, a third resistor may be provided in the alternative of a current mirror, wherein the third resistor may be connected between the second current input and the inverting input of the second operational amplifier.

By the help of the third resistor, oscillations may be further reduced. Another aspect of the present disclosure is that the first current source may be a photodetector configured to convert light into current. It may be preferred that the photodetector is a photodiode, a phototransistor or a photoresistor. With the apparatus according to one example of the present disclosure, small input currents may be measured and further processes, such as small currents provided by a photodiode, a phototransistor or a photoresistor.

According to one example of the present disclosure, the non-inverting inputs of the first and the second operational amplifier are connected to ground.

An input current results in an output voltage that is representative for the input current. Therefore, the apparatus may be used for example in receivers for optical communications. A photodiode provides a photo current. For measurement of the photo current, the cathode of a photodiode may be connected to a bias voltage and the anode of the photodiode may be connected via the first current input to the non-inverting input of the first operational amplifier. The inverting and the non-inverting input voltage of the first operational amplifier may be ideally managed to zero due to the low input resistance of the first operational amplifier. Therefore, the photo current of a photo diode connected to the non-inverting input of the first operational amplifier may be linear over a wide range of intensity of inclined light and maintains a high bandwidth.

One of the advantages of the present disclosure is that the physical properties of a current mirror output are similar to the physical properties of a photodiode. In contrast to applying a test current directly to the second operational amplifier, the current mirror provides a non-capacitive current source similar to the photodiode applied to the second operational amplifier. Therefore, the behaviour of the apparatus may be identically independent of applying a photo current from a photodiode or a test current via the current mirror.

According to one example of the present disclosure, the output of the first operational amplifier may be connected in series to the non-inverting input of a cascade amplifier and the output of the second operational amplifier may be connected in series to the inverting input of a cascade operational amplifiers.

A cascade amplifier may be an amplifier constructed from a series of amplifiers, where each amplifier sends its output to the input of the next amplifier in a daisy chain. With the help of the cascade amplifier, the output voltage of the first operational amplifier may be amplified further.

According to a further example of the present disclosure, a first feedback transistor may be connected between the output and the inverting input of the first operational amplifier and a second feedback transistor may be connected between the output and the inverting input of the second operational amplifier.

With the first and the second transistor the gain of the first operation amplifier may be controlled automatically.

According to another example of the present disclosure, the first feedback resistor and the first feedback transistor may be connected in parallel and the second feedback resistor and the second feedback transistor may be connected in parallel.

According to another example of the present disclosure the first feedback transistor may be operated by the output of the first operational amplifier and the second feedback transistor may be operated by the output of the second operational amplifier or the first feedback transistor may be configured to be operated by the output of the first and the second operational amplifier and the second feedback transistor is configured to be operated by the output of the first and the second operational amplifier.

This allows an automatic gain control depending on the input current of the first and second operational amplifier respectively.

According to a further example of the present disclosure, the first or second feedback transistors may be a metal-oxide-semiconductor field-effect transistor (MOSFET) or a bipolar transistor. In particular, the first feedback transistor may be a n-channel MOSFET and the source of the first feedback transistor may be connected to the inverting input of the first operational amplifier and the drain of the first feedback transistor may be connected to the output of the first operational amplifier and the second feedback transistor may be a n-channel MOSFET and the source of the second feedback transistor may be connected to the inverting input of the second operational amplifier and the drain of the second feedback transistor may be connected to the output of the second operational amplifier.

According to one example, it may be preferred that the gate of the first and the gate of the second feedback transistor may be connected to a first output of a third operational amplifier, and the non-inverting input of the third operational amplifier may be connected to the output of the first operational amplifier or the non-inverting output of the cascade amplifier and the inverting input of the third operational amplifier may be connected to the output of the second operational amplifier or the inverting output of the cascade amplifier.

Furthermore, according to one example of the present disclosure, a second output is provided at the third operational amplifier having a different operating point than the first output of the third operational amplifier.

The first respectively the second output of the third operational amplifier may be operated by the inverting and the non-inverting input of the third operational amplifier.

Thereby, the gain of the output of the first and the second amplifier may be controlled automatically.

According to a further example of the present disclosure, the inverting input of the first operational amplifier may be connected to ground via a third transistor. Thereby, it may be preferred that the third transistor may be by the output of the first and the output of the second operational amplifier or the non-inverting output and the inverting output of the cascade amplifier.

With the help of the third transistor an automatic offset cancellation for a direct current portion of a current may be provided. The test current comprises a direct current and an alternating current portion in general. The direct current portion of the test current may be cancelled by the third transistor at the voltage measured at the voltage output of the apparatus. In case the test current being applied to the inverting input of the first operational amplifier, a current may flow via the third transistor from the inverting input of the first operational amplifier to ground.

It may be of advantage that the output voltage of the output of the first operational amplifier may be amplified by the cascade amplifier and optionally by the third operational amplifier to cancel the direct current portion of the test current.

Thereby, the offset cancellation for a direct current may be tested.

Thereby, according to one example of the present disclosure, the third transistor may be a n-channel MOSFET and the gate of the third transistor may be connected to the inverting output of the third operational amplifier and the non-inverting input of the third operational amplifier is connected to the output of the first operational amplifier or the non-inverting output of the cascade amplifier and the inverting input of the third operational amplifier is connected to the output of the second operational amplifier or the inverting output of the cascade amplifier.

The input signal of the apparatus, e.g. the input signal provided by a photodiode, may have a certain ratio of its average value to its amplitude. Therefore, based on the average value the amplitude of the input signal may be determined. Said average value may be subtracted with the help of the offset cancellation. If the average value exceeds a predetermined value, the amplification may be reduced by the help of the first and the second feedback transistor respectively.

According to one example of the present disclosure, at least the output of the first operational amplifier, the non-inverting output of the cascade amplifier, the output of the second operational amplifier or the inverting output of the cascade amplifier are connected to the at least one voltage output. According to one example, the output of the first amplifier or the non-inverting output of the cascade amplifier may be connected to a first voltage output and the output of the second operational amplifier or the inverting output of the cascade amplifier may be connected to a second voltage output.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE DRAWINGS

While illustrative examples are illustrated and described below, it will be appreciated that various changes can be made therein without departing from the spirit and scope of the disclosure. In that regard, the detailed description set forth below, in connection with the appended drawings is intended only as a description of various examples of the disclosed subject matter and is not intended to represent the only examples. Each example described in this disclosure is provided merely as an example or illustration and should not be construed as preferred or advantageous over other examples. The illustrative examples provided herein are not intended to be exhaustive or to limit the disclosure to the precise forms disclosed. Similarly, any steps described herein may be interchangeable with other steps, or combinations of steps, in order to achieve the same or substantially similar result.

Figure 1:
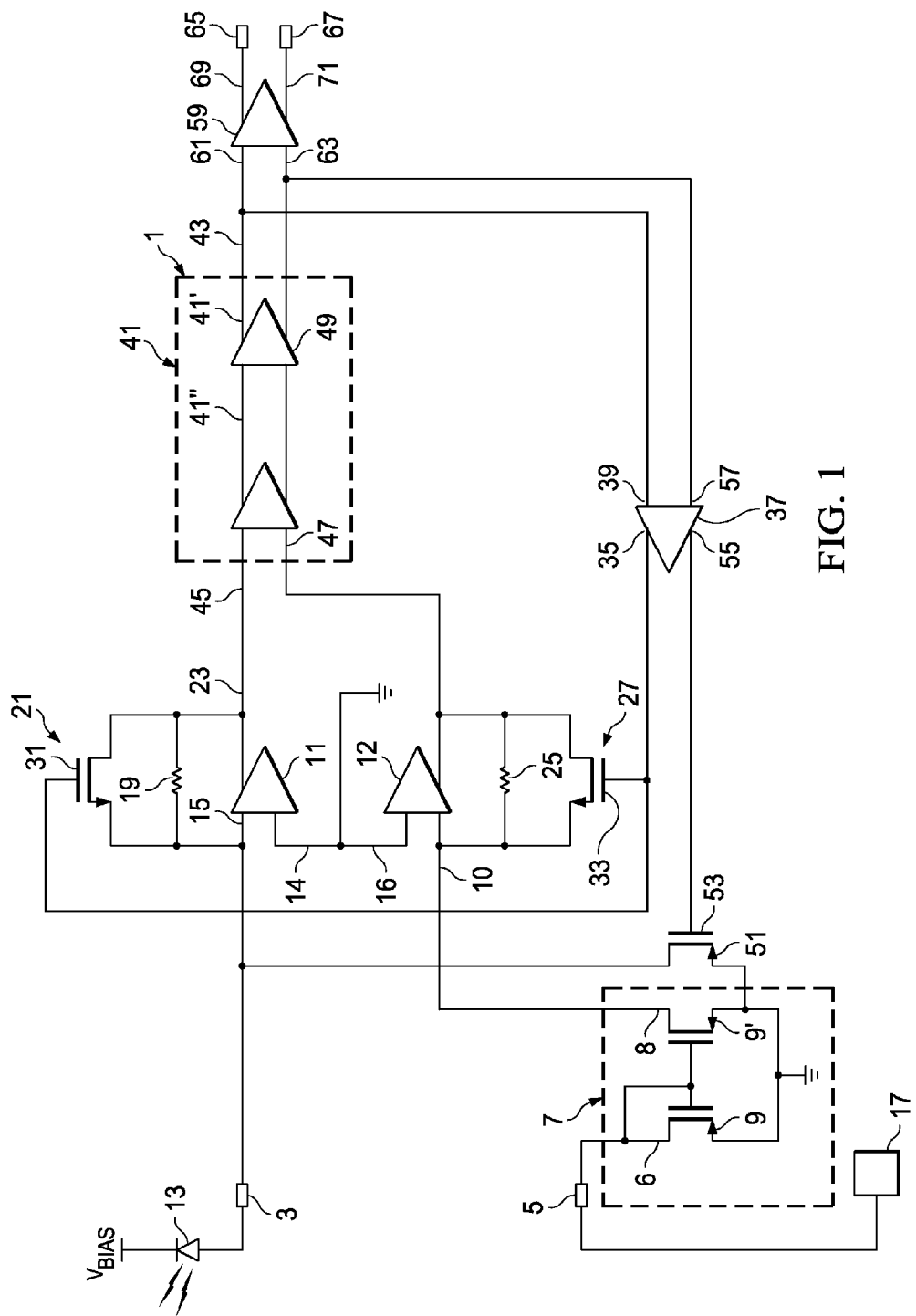
FIG. 1 is a schematic diagram illustrating one example of an apparatus of the present disclosure.

Examples of the present disclosure may be practiced with an apparatus shown in FIG. 1. The apparatus 1 comprises a first current input 3 and a second current input 5. The apparatus 1 may be configured to convert an input current to an output voltage. According to one example of the present disclosure, a first current source may be connected to the first current input 3 and for testing the successful operation of the apparatus a test current may be applied to the second current input 5.

According to this example of the present disclosure, the first current input 3 may be connected to the anode of a photodiode 13. The cathode of the photodiode 13 may be connected to a bias voltage. The second current input 5 may be connected to an input 6 of a current mirror 7. The current mirror 7 comprises two transistors 9, 9'. The first current input 3 may be connected to an inverting input 15 of a first operational amplifier 11. The current mirror output 8 may be connected to the inverting input 10 of a second operational amplifier 12. The non-inverting inputs 14, 16 of the first and second operational amplifier 11, 12 may be connected to ground.

The voltage between the inverting inputs 10, 15 and the non-inverting input 14, 16 of the first and the second operational amplifier 11, 12 may ideally be zero. Therefore, the photo current of the photodiode 13 that applied to the first input 3 may be linear through a wider range of operation of the photodiode 13. A test current generator 17 for generating the test current applied to the second input 5 has an inductance. Due to the high gain of the apparatus 1, this inductance may cause oscillations. The current mirror output 8 of the current mirror 7 copies the test current that may be applied to the second current input 5. The current mirror output 8 may be connected to the inverting input 10 of the second operational amplifier 12. The second operational amplifier 12 has a limited bandwidth compared to the first operational amplifier 11 so that oscillations of the apparatus may be avoided. Furthermore, the higher bandwidth of the inverting input 3 of the first operational amplifier 11 is maintained.

According to a this example of the present disclosure, a first feedback resistor 19 and first feedback transistor 21 are connected between the output 23 and the inverting input 15 of the first operational amplifier 11 and a second feedback resistor 25 and a second feedback transistor 27 are connected between the output 29 and the inverting input 10 of the second operational amplifier 12. Thereby, it may be preferred that the gain bandwidth of the second operational amplifier 12 may provide an amplification of lower frequencies than the first operational amplifier 11 to avoid oscillations.

According to the present example, the first and the second transistor 21, 27 are n-channel metal-oxide-semiconductor field-effect transistor (MOSFET) transistors, wherein the first gate 31 of the first transistor 21 and the second gate 33 of the second transistor 27 are connected to the first output 35 of a third operational amplifier 37. The non-inverting input 39 of the third operational amplifier 37 may be connected to the non-inverting output 43 of a cascade amplifier 41. The inverting input 57 of the third operational amplifier 37 may be connected to the inverting output 49 the cascade amplifier 41.

According to this example of the present disclosure, the non-inverting input 45 of the cascade amplifier 41 may be connected to the output of the first operational amplifier 11. The inverting input 47 of the cascade amplifier 41 may be connected to the output 29 of the second operational amplifier 12.

This disclosure relates to an apparatus configured to detect three different voltage inputs The cascade amplifier 41 comprises a series of operational amplifiers 41', 41", and each operational amplifier 41', 41" sends its output to the input of the next amplifier in a daisy chain. With the help of the cascade amplifier, the output voltages of the first operational amplifier 11 may be amplified further.

Therefore, according to this example, with the help of the first and the second transistors 21, 27 the gain of the apparatus may be controlled automatically.

According to one example of the present disclosure, a third transistor 51 may be connected to the inverting input 15 of the first amplifier 11 and to ground. With the help of the third transistor 51 an automatic offset cancellation may be provided. The input currents comprise a direct current and an alternating current portion. In the present example, the third transistor 51 may be a MOSFET and the gate 53 of the third transistor 51 may be connected to the second output 55 of the third operational amplifier 37. Again, like the first output 35 of the third operational amplifier 37 the second output 55 may be operated by the output 23 of the first operational amplifier 11 and the output 29 of the second operational amplifier 12, wherein both outputs 35, 55 of the third operational amplifier have different operating points.

According to one example, it may be of advantage that the non-inverting output 43 of the cascade amplifier 41 may be connected to a non-inverting input 61 of a fourth operational amplifier 59 and the inverting output 49 of the cascade amplifier 41 may be connected to an inverting input 63 of the fourth operational amplifier 59. A first voltage output 65 may be connected to the non-inverting output 69 of the fourth operational amplifier 59 and a second voltage output 67 may be connected to the inverting output 71 of the fourth operational amplifier 59.

For testing the successful operation of the apparatus according to one example of the present disclosure, a test current may be generated by the test current generator 17. The test current may be applied to the current mirror input 6 of the current mirror 7 and a copied test current may be applied by the current mirror output 8 to the inverting input 10 of the second operational amplifier 12. The test current applied to the inverting input 10 results in a test voltage at the output 29 of the second operational amplifier 12. The test voltage may be amplified by the cascade amplifier 41 and further amplified by the fourth operational amplifier 59 and may be measured at the voltage outputs 65, 67.

The automatic gain control of the amplification of the second operational amplifier 12 for the test current may be provided by the feedback transistor 27. With the help of the third transistor 51 the direct current portion of the test current may be cancelled at the voltage measured at the outputs 65, 67.

With an apparatus according to the present disclosure it is therefore possible to test the successful operation of a current-to-voltage conversion as well as of the direct current cancellation at the same time.

A use of current-generated by a photodiode according to one example of the present disclosure may be applied to the inverting input 15 of the first operational amplifier 11 directly. The use current applied to the inverting input 15 may results in a use voltage representative for the use current at the output 23 of the first operational amplifier 11. The use voltage may be amplified by the cascade amplifier 41 and further amplified by the fourth operational amplifier 59. The use voltage may be measured at the voltage outputs 65, 67. The automatic gain control of the first operational amplifier 11 for the use current may be provided by the first transistor 21. With the help of the third transistor 51 the direct current portion of the use current may be cancelled.

Figure 2:
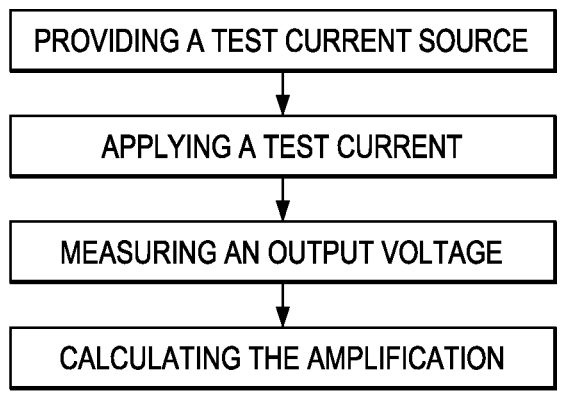
FIG. 2 is a flow chart illustrating one example of operating an apparatus of the present disclosure.

FIG. 2 shows a flow chart illustrating one example of operating an apparatus of the present disclosure.

An apparatus according to the present disclosure may be operated by a method comprising the following steps. At first, a test current source may be provided. Afterwards, the test current source may be connected to the second current input. The test current source may be operated to generate a test current. The copied test current may than be applied to the inverting input of the second operational amplifier. Optionally, by the help of the third transistor, the direct current portion of the test current may be cancelled. The output voltage of the second operational amplifier may than be amplified by the cascade amplifier and optionally further amplified by the fourth operational amplifier. The output voltage may than be measured at the first or second voltage outputs. By dividing the output voltage measured over the known input current, the gain of the apparatus may be calculated. Thereby, the successful operation of the apparatus may be tested.

The embodiments of the invention in which an exclusive property or privilege is claimed are defined as follows:

1. Apparatus comprising:
    at least two operational amplifiers;
    a first and a second current input;
    at least one voltage output; and
    at least two feedback resistors, wherein:
        a first current source is connectable to the first current input, and a test current source is connectable to the second current input, and wherein
        the first current input is connected to an inverting input of the first operational amplifier and
        the second current input is connected to an inverting input of the second operational amplifier, and
        a first feedback resistor is connected between the output and the inverting input of the first operational amplifier and a second feedback resistor is connected between the output and the inverting input of the second operational amplifier, and wherein
        the at least one voltage output is connected to the outputs of the first and the second operational amplifier, and
    a current mirror, wherein the current mirror is connected between the second current input and the inverting input of the second operational amplifier, wherein a current mirror input of the current mirror is connected to the second current input and a current mirror output is connected to the inverting input of the second operational amplifier.

2. Apparatus according to claim 1, characterized in that the first current source is a photodetector configured to convert light into current, wherein the photodetector is a photodiode, wherein the cathode of the photodiode is connected to a bias voltage and the anode of the photodiode is connected to the first current input, a phototransistor or a photoresistor.

3. Apparatus according to claim 1, characterized in that the non-inverting inputs of the first and the second operational amplifiers are connected to ground.

4. Apparatus according to claim 1, characterized in that the output of the first operational amplifier is connected in series to the non-inverting input of a cascade amplifier and the output of the second operational amplifier is connected in series to the inverting input of a cascade operational amplifiers.

5. Apparatus according to claim 1, characterized in that:
    a first feedback transistor is connected between the output and the inverting input of the first operational amplifier and
    a second feedback transistor is connected between the output and the inverting input of the second operational amplifier.

6. Apparatus according to claim 5, characterized in that the first feedback resistor and the first feedback transistor are connected in parallel and the second feedback resistor and the second feedback transistor are connected in parallel.

7. Apparatus according to claim 5, characterized in that the first feedback transistor is configured to be operated by the output of the first operational amplifier and the second feedback transistor is configured to be operated by the output of the second operational amplifier or the first feedback transistor is configured to be operated by the output of the first and the second operational amplifier and the second feedback transistor is configured to be operated by the output of the first and the second operational amplifier.

8. Apparatus according to claim 5, characterized in that the first feedback transistor or second feedback transistor is a metal-oxide-semiconductor field-effect transistor (MOSFET) or a bipolar transistor.

9. Apparatus according to claim 8, characterized in that:
    the first feedback transistor is a n-channel MOSFET and the source of the first feedback transistor is connected to the inverting input of the first operational amplifier and the drain of the first feedback transistor is connected to the output of the first operational amplifier; and the second feedback transistor is a n-channel MOSFET and the source of the second feedback transistor is connected to the inverting input of the second operational amplifier and the drain of the second feedback transistor is connected to the output of the second operational amplifier, wherein the gate of the first and the gate of the second feedback transistor is connected to a first output of a third operational amplifier, and the non-inverting input of the third operational amplifier is connected to the output of the first operational amplifier or the non-inverting output of the cascade amplifier and the inverting input of the third operational amplifier is connected to the output of the second operational amplifier or the inverting output of the cascade amplifier.

10. Apparatus according to claim 1, characterized in that the first operational amplifier is configured to provide a gain bandwidth broader than the gain bandwidth of the second operational amplifier, wherein the first operational amplifier is configured to provide a gain bandwidth of 500 MHz to 6 GHz and the second operational amplifier is configured to provide a gain bandwidth of 50 MHz to 300 MHz.

11. Apparatus according to claim 1, characterized in that the inverting input of the first operational amplifier is connected to ground via a third feedback transistor, the third feedback transistor being operated by the output of the first and the output of the second operational amplifier or the non-inverting output and the inverting output of a cascade amplifier, wherein the non-inverting input of a third operational amplifier is connected to the output of the first operational amplifier or the non-inverting output of the cascade amplifier and the inverting input of the third operational amplifier is connected to the output of the second operational amplifier or the inverting output of the cascade amplifier and the second output of the third operational amplifier is connected to the third feedback transistor, wherein the third feedback transistor is a MOSFET or a bipolar transistor, wherein the third feedback transistor is a n-channel MOSFET and the gate of the third feedback transistor is connected to a second output of the third operational amplifier.

12. Apparatus according to claim 1, characterized in that at least the output of the first operational amplifier, the non-inverting output of the cascade amplifier, the output of the second operational amplifier or the inverting output of the cascade amplifier are connected to the at least one voltage output.

13. Apparatus according to claim 12, characterized in that the output of the first amplifier or the non-inverting output of the cascade amplifier are connected to a first voltage output and the output of the second operational amplifier or the inverting output of the cascade amplifier are connected to a second voltage output.

14. Apparatus according to claim 12, characterized in that at least the output of the first amplifier, the non-inverting output of the cascade amplifier, the output of the second amplifier or the inverting output of the cascade amplifier are connected to the at least one voltage output via a fourth operational amplifier.

15. Apparatus comprising:
at least three operational amplifiers;
a first and a second current input;
at least one voltage output;
a current mirror; and
at least two feedback resistors, wherein:

a first current source is connectable to the first current input, the first current source being a photodetector configured to convert light into current, and a test current source is connectable to the second current input, and wherein the first current input is connected to an inverting input of the first operational amplifier and the second current input is connected to an inverting input of the second operational amplifier, wherein the current mirror is connected between the second current input and the inverting input of the second operational amplifier, and wherein a first feedback resistor and a first feedback transistor are connected in parallel and between the output and the inverting input of the first operational amplifier and a second feedback resistor and a second feedback transistor are connected in parallel and between the output and the inverting input of the second operational amplifier, and wherein the first feedback resistor and the first feedback transistor are connected in parallel and the second feedback resistor and the second feedback transistor are connected in parallel, and wherein the non-inverting input of a third operational amplifier is connected to the output of the first operational amplifier and the inverting input of the third operational amplifier is connected to the output of the second operational amplifier, the third operational amplifier having a first and a second output, the first and the second output having different operating points, and wherein the first and the second feedback transistors being operated by the first output of the third operational amplifier, and wherein the first operational amplifier is configured to provide a gain bandwidth of 500 MHz to 6 GHz and the second operational amplifier is configured to provide a gain bandwidth of 50 MHz to 300 MHz, and wherein the inverting input of the second operational amplifier is connected to ground via a third transistor, the third transistor being operated by the second output of the third operational amplifier, and wherein the at least one voltage output is connected to the outputs of the first and the second operational amplifier, characterized in that the first current source is a photodetector configured to convert light into current, wherein the photodetector is a photodiode, wherein the cathode of the photodiode is connected to a bias voltage and the anode of the photodiode is connected to the first current input, a phototransistor or a photoresistor.

16. A method for testing a transimpedance amplifier employing an apparatus according to claim 1, the method comprising:
connecting a test current source to the second current input and applying test current to the second current input; and
measuring the voltage at the voltage output,
decoupling the test current from the test current source by copying the test current with a current mirror; and
applying the decoupled test current to the inverting input of the second operational amplifier.

17. The method according to claim 16, further comprising:
amplifying the output voltage of the output of the second operational amplifier with a cascade amplifier.

18. The method according to claim 16, further comprising:
calculating the amplification of the apparatus by dividing the output voltage over the test current.

* * * * *